(12) United States Patent
Choi et al.

(10) Patent No.: US 7,268,414 B2
(45) Date of Patent: Sep. 11, 2007

(54) SEMICONDUCTOR PACKAGE HAVING SOLDER JOINT OF IMPROVED RELIABILITY

(75) Inventors: Seung-yong Choi, Kyungki-do (KR); Seung-han Paek, Seoul (KR)

(73) Assignee: Fairchild Korea Semiconductor Ltd., Seoul (KR)

( * ) Notice: Subject to any disclaimer, the term of this patent is extended or adjusted under 35 U.S.C. 154(b) by 0 days.

(21) Appl. No.: 10/379,979

(22) Filed: Mar. 4, 2003

(65) Prior Publication Data

US 2003/0209785 A1 Nov. 13, 2003

(51) Int. Cl.
*H01L 23/495* (2006.01)

(52) U.S. Cl. ............ 257/666; 257/787; 257/E13.037

(58) Field of Classification Search ........ 257/666–668, 257/672, 676, 772, 779, 783, 787, 793, E23.031, 257/E23.037, E23.039, E23.116
See application file for complete search history.

(56) References Cited

U.S. PATENT DOCUMENTS

| | | | |
|---|---|---|---|
| 4,668,032 A | 5/1987 | Bouvier et al. | |
| 4,705,205 A | 11/1987 | Allen et al. | |
| 4,814,947 A | 3/1989 | Gunter | |
| 4,847,136 A | 7/1989 | Lo | |
| 4,878,611 A | 11/1989 | LoVasco et al. | |
| 5,041,901 A | 8/1991 | Kitano et al. | |
| 5,441,195 A | 8/1995 | Tustaniwskyj et al. | |
| 5,639,013 A | 6/1997 | Jairazbhoy et al. | |
| 5,759,730 A | 6/1998 | Hermansen et al. | |
| 5,931,371 A | 8/1999 | Pao et al. | |
| 5,936,846 A | 8/1999 | Jairazbhoy et al. | |
| 6,049,466 A | 4/2000 | Jairazbhoy | |
| 6,129,955 A | 10/2000 | Papathomas et al. | |
| 6,211,462 B1* | 4/2001 | Carter, Jr. et al. | 174/52.4 |
| 6,534,391 B1* | 3/2003 | Huemoeller et al. | 438/612 |
| 6,630,373 B2* | 10/2003 | Punzalan et al. | 438/123 |
| 2002/0003292 A1* | 1/2002 | Abbott et al. | 257/666 |

* cited by examiner

*Primary Examiner*—Hoa Pham
(74) *Attorney, Agent, or Firm*—Kenneth E. Horton; Kirton & McConkie

(57) ABSTRACT

A semiconductor package mounted on a printed circuit board using improved-reliability solder joints is described. The semiconductor package includes a lead frame pad and lead frame lead attached to the solder joints, a semiconductor chip mounted on top of the lead frame pad, wires electrically connecting the semiconductor chip and the lead frame lead, an epoxy molding compound that exposes the lower portion surface of the lead frame pad and part of the lead frame lead, and protrusions fixed to the lower portion surface of the epoxy molding compound and positioned between the solder joints, with the protrusions supporting the semiconductor package when the epoxy molding compound is mounted on the printed circuit board.

16 Claims, 2 Drawing Sheets

SEMICONDUCTOR PACKAGE HAVING SOLDER JOINT OF IMPROVED RELIABILITY

FIELD OF THE INVENTION

The present invention generally relates to a semiconductor package. More particularly, the present invention related to a semiconductor package having a solder joint of improved reliability that is used for a surface mount.

BACKGROUND OF THE INVENTION

As electric circuit components become increasingly miniaturized and the applicable technologies of integrated circuit devices become increasingly varied, it becomes increasingly necessary to stably mount a semiconductor package on a printed circuit board. To mount a semiconductor package on a printed circuit board, solder joints are often formed on the surface of the printed circuit board where the semiconductor package will be mounted. The semiconductor package is then placed on the printed circuit board at the location of the solder joints. Subsequently, a reflow process is performed at a high temperature to make the semiconductor package and the printed circuit board stick to each other via the solder joints.

FIG. 1 is a cross-sectional diagram illustrating a conventional semiconductor package, printed circuit board, and solder joints before a reflow process. FIG. 2 is a cross-sectional diagram showing the same structure after the reflow process. As shown in FIG. 1, a thermal-mechanical stress is not applied to solder joints 30 positioned between a printed circuit board 10 and a semiconductor package 20 before the reflow process. Thus, the solder joints 30 have a thickness $d_{11}$ and are maintained a distance $d_{21}$ apart from adjacent solder joints 30.

As shown in FIG. 2, when the reflow process is performed at a predetermined temperature (e.g., at about 200-300° C.) for a predetermined time, a thermal-mechanical stress is applied and the solder joints 35 become pressed down to the right and the left. As a result, the solder joints 35 have a second thickness $d_{12}$, which is thinner than the thickness $d_{11}$ of the solder joints 30 before the reflow process. After the re-flow process, adjacent solder joints 35 are spaced apart by a distance $d_{22}$, which is narrower than the space $d_{21}$ of the solder joints 30 before the reflow process.

As the thickness of solder joints 35 becomes thinner, a decrease in reliability (such as decreasing fatigue life) can result. For example, where the printed circuit board 10 and the semiconductor package 20 are made of different materials (and thus expand at different rates due to their different thermal expansion coefficients), the solder joints 35 should be modified appropriately to connect the printed circuit board 10 and the semiconductor package 20. If the solder joints 35 are thin, however, the range of such modification is limited and the solder joints may even be severed, thus reducing reliability of a device. In another example, the solder joints 35 may have different thicknesses and the attached semiconductor package 20 can become tilted. Thus, the fatigue life of a particular solder joint applied with relatively more stress will be shortened considerably. Consequently, the reliability of a device is damaged.

SUMMARY OF THE INVENTION

To solve the above-described problems, the present invention provides a semiconductor package having a solder joint of improved reliability between the printed circuit board and the semiconductor package.

The present invention includes a semiconductor package mounted on a printed circuit board using solder joints where the package contains a lead frame pad and lead frame lead attached to the solder joints, a semiconductor chip mounted on top of the lead frame pad, wires connecting the semiconductor chip and the lead frame lead electrically, an epoxy molding compound that exposes the lower portion surface of the lead frame pad and part of the lead frame lead, and protrusions fixed to the lower portion surface of the epoxy molding compound and positioned between the solder joints, with the protrusions supporting the semiconductor package when the epoxy molding compound is mounted on the printed circuit board. The protrusions can be formed of the same material as the epoxy molding compound. The number of protrusions can be at least three.

The present invention also includes a semiconductor package mounted on a printed circuit board using solder joints, the package containing a lead frame pad, a semiconductor chip mounted on top of the lead frame pad, a lead frame lead fixed to the solder joints, wires connecting the semiconductor chip and the lead frame lead electrically, an epoxy molding compound that exposes part of the lead frame lead, and protrusions fixed to the lower portion surface of the epoxy molding compound and positioned between the solder joints, with the protrusions supporting the semiconductor package when the epoxy molding compound is mounted on the printed circuit board. The protrusions can formed of the same material as the epoxy molding compound. The number of protrusions can be at least three.

BRIEF DESCRIPTION OF THE DRAWINGS

The above objects and advantages of the present invention will become more apparent by describing in detail preferred embodiments thereof with reference to the attached drawings in which:

FIGS. 1-4 presented in conjunction with this description are views of only particular—rather than complete—portions of the devices and methods of making the devices according to the invention. Together with the following description, the Figures demonstrate and explain the principles of the invention.

DETAILED DESCRIPTION OF THE INVENTION

Figure 1:
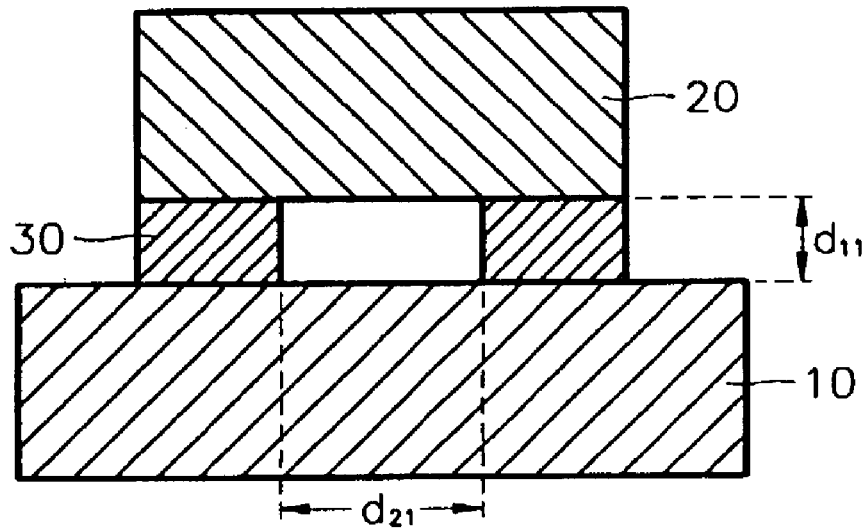
FIGS. 1 and 2 are cross-sectional diagrams a conventional semiconductor device.
Figure 2:
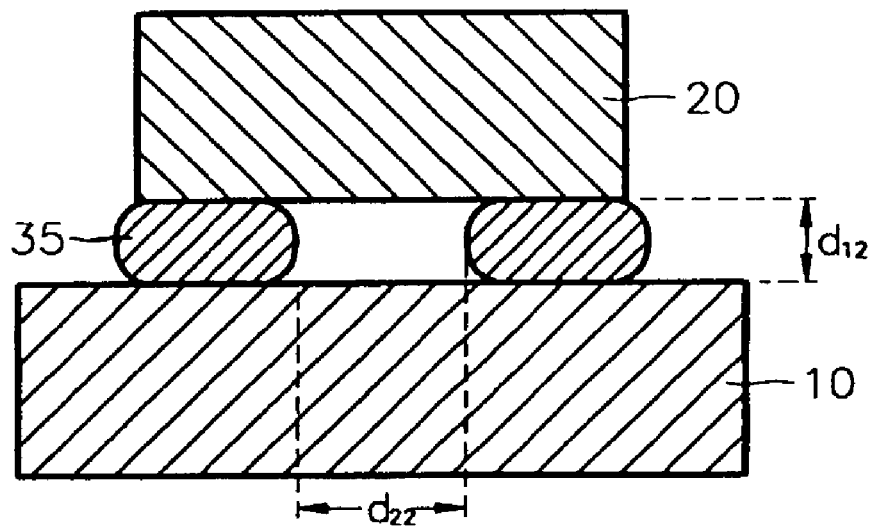

The present invention now will be described more fully with reference to the accompanying drawings, in which preferred aspect of the invention are shown. This invention may, however, be embodied in many different forms and should not be construed as being limited to the aspects set forth herein; rather, these aspects are provided so that this disclosure will be thorough and complete and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

Figure 3:
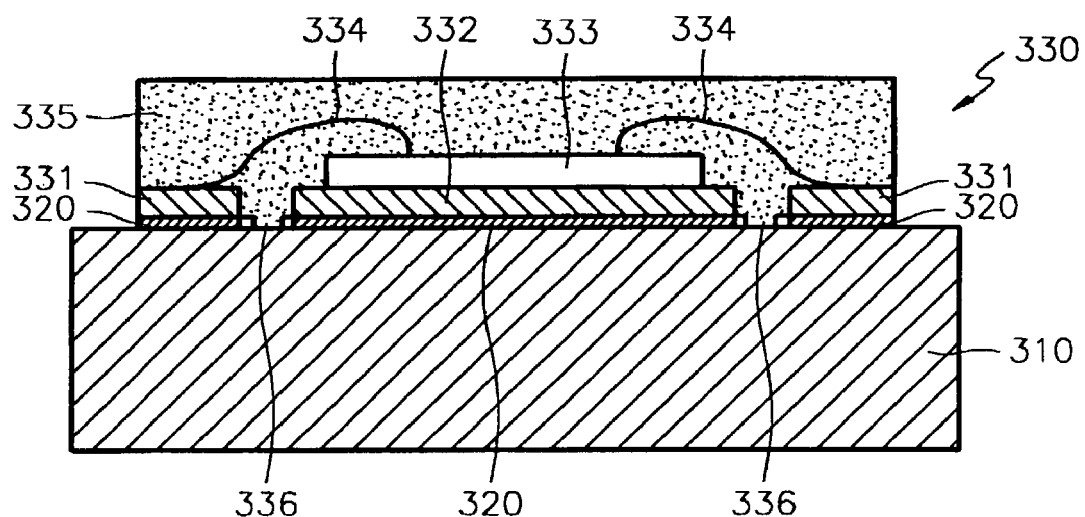
FIG. 3 is a cross-sectional diagram showing a semiconductor package mounted on a printed circuit board according to one aspect of the present invention.

FIG. 3 represents a cross section of a semiconductor package 330 mounted on a printed circuit board 310 according to one aspect of the present invention. In FIG. 3, the semiconductor package 330 is mounted on one surface of the printed circuit board 310 by solder joints 320. The semiconductor package 330 comprises a molded leadless package (MLP) and lead frame leads 331, a lead frame pad 332, a semiconductor chip 333, wires 334, an epoxy molding compound (EMC) 335, and protrusions 336. The EMC 335 surrounds part of the lead frame leads 331, part of the lead frame pad 332, as well as the semiconductor chip 333 and the wires 334 completely. In other words, part of the lead frame leads 331, the lower portion surface of the lead frame pad 332, and the protrusions 336 are exposed beyond the EMC 335. The semiconductor chip 333 is attached to the upper surface of the lead frame pad 332 within the EMC 335. The wires 334 electrically connect the lead frame leads 331 and the semiconductor chip 333 within the EMC 335.

The protrusions 336 are formed on the exposed surface of the lower portion of the EMC 335 and are made of the same material as the EMC 335. Positioned between the solder joints 320, the protrusions 336 maintain a regular vertical space between the printed circuit board 310 and the semiconductor package 330 when the semiconductor package 330 is mounted on the printed circuit board 310. In other words, after the solder joints 320 are formed on the printed circuit board 310 by using any method, such as screen printing, the semiconductor package 330 is placed on top of the solder joints 320. The protrusions 336 are then positioned between the solder joints 320. Subsequently, a re-flow process is carried out.

At this time, even if the solder joints 320 become fluidized, they receive little pressure from the semiconductor package 330 because the protrusions support the semiconductor package 330. Accordingly, the solder joints 320 maintain almost the same thickness as that before the re-flow process, even after the re-flow process is complete.

In one aspect of the invention, the protrusions 336 may be formed in any molding process step during the semiconductor package fabrication process. That is, after the processes of substrate attaching and wire bonding, the resulting object is placed in a molding device and an encapsulation process is performed to provide an epoxy molding compound. The molding device includes a predetermined cast shape for the EMC 335, thereby forming the predetermined shape. The protrusions 336 can be formed by using corresponding shapes in the cast and supplying the material for the EMC 335 to the cast. In forming the protrusions 336, the cast of the molding device is modified slightly and the amount of EMC to be supplied is increase by about 1%. In one aspect of the invention, the number of protrusions 336 is at least three, thereby maintain an appropriate balance of the semiconductor package 330.

Figure 4:
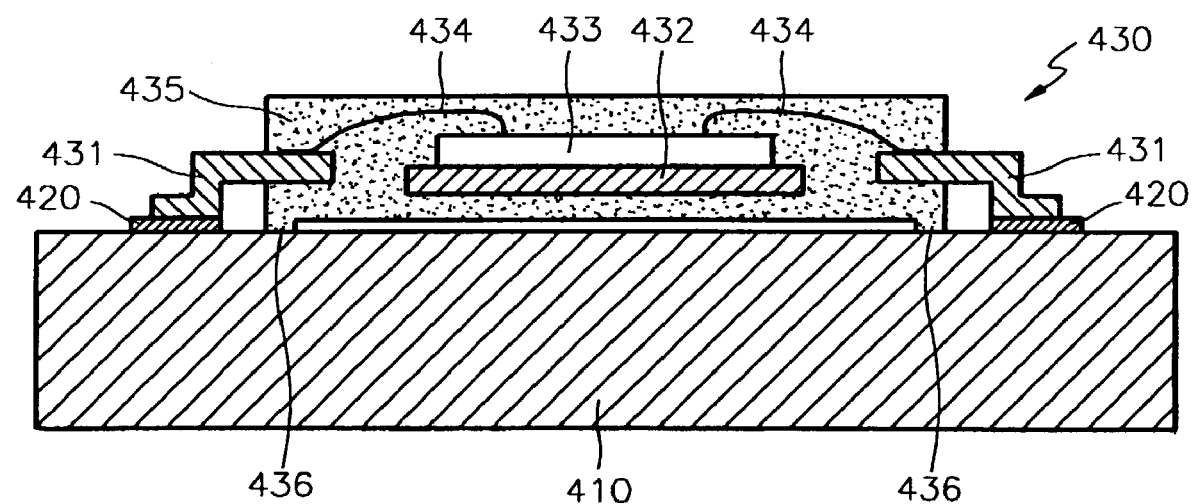
FIG. 4 is a cross-sectional diagram describing a semiconductor package mounted on a printed circuit board according to another aspect of the present invention.

FIG. 4 describes a cross section of a semiconductor package 430 mounted on a printed circuit board 410 according to another aspect of the present invention. In FIG. 4, the semiconductor package 430 is mounted on one surface of the printed circuit board 410 using solder joints 420. The semiconductor package 430 is a surface mount device (SMD) type of package and comprises lead frame leads 431, a lead frame pad 432, a semiconductor chip 433, wires 434, an epoxy molding compound (EMC) 435, and protrusions 436. The EMC 435 surrounds these components, except for part of the lead frame leads 431 and the protrusions 436 which are left exposed.

In the semiconductor package 430, part of the lead frame leads 431 is exposed beyond the EMC 435. Thus, the semiconductor package 430 is mounted on the printed circuit board 410 using the solder joints 420 positioned therebetween. In this aspect of the invention, the protrusions 436 are formed on the exposed surface of the lower portion of the EMC 435. Being positioned between the solder joints 420, the protrusions 436 maintain a regular vertical space between the printed circuit board 410 and the semiconductor package 430 when the semiconductor package 430 is mounted on the printed circuit board 410. Even if the solder joints 420 become fluidized, they receive little pressure from the semiconductor package 430 because the protrusions 436 support the semiconductor package 430. Accordingly, the solder joints 420 maintain almost the same thickness as before the reflow process, even after the reflow process is complete. In one aspect of the invention, the number of protrusions 436 is at least three, thereby appropriately maintaining the balance of the semiconductor package 430.

While this invention has been particularly shown and described with reference to preferred aspects thereof, it will be understood by those skilled in the art that various changes in form and details may be made therein without departing from the spirit and scope of the invention as defined by the appended claims.

As described above, with protrusions formed between a printed circuit board that contains a semiconductor package thereon, the present invention solves a problem that the thickness of solder joints is lowered during a reflow process that is performed to mount the semiconductor package on the printed circuit board. As a result, this invention provides an advantage of longer fatigue life of the solder joints, and thus improves reliability. For example, in an experiment of thermal cycle (TMCL) where the temperature is varied from −40° C. to 125° C. in an MLP type semiconductor package, the semiconductor package of the present invention having protrusions as described herein showed an increase in fatigue life of about 16 to about 237% when compared to a conventional semiconductor package not having such protrusions.

What is claimed is:

1. A semiconductor package mounted on a printed circuit board using solder joints, comprising:
   a lead frame pad and lead frame lead attached to the solder joints;
   a semiconductor chip mounted on top of the lead frame pad;
   wires connecting the semiconductor chip and the lead frame lead electrically;
   an epoxy molding compound that exposes the lower portion surface of the lead frame pad and part of the lead frame lead; and
   protrusions fixed to an exposed surface of the lower portion of the epoxy molding compound and positioned between the solder joints, the protrusions extending beyond the lowest portion of the lead frame lead to support all of the semiconductor package when the semiconductor package is mounted on the printed circuit board.

2. The semiconductor package of claim 1, wherein the protrusions are formed of the same material as the epoxy molding compound.

3. The semiconductor package of claim 1, wherein the number of protrusions is at least three.

4. A semiconductor device, comprising:
a circuit board;
a semiconductor package containing a semiconductor chip encapsulated by an encapsulant, the package located on the circuit board;
a solder joint located between the circuit board and the semiconductor package; and
a protrusion located between the circuit board and the semiconductor package, the protrusion extending beyond the lowest portion of a lead frame lead and contacting the circuit board to support all of the semiconductor package when it is mounted on the circuit board.

5. The device of claim 4, wherein the semiconductor package is mounted on the circuit board using the solder joint.

6. The device of claim 4, wherein there is a plurality of solder joints and the protrusion is positioned between the solder joints.

7. The device of claim 4, wherein the protrusion comprises the same material as the encapsulant.

8. The device of claim 4, where the encapsulant is an epoxy molding compound.

9. The device of claim 4, wherein there are at least three protrusions.

10. A semiconductor device, comprising:
a circuit board;
a semiconductor package containing a semiconductor chip encapsulated by an encapsulant, the package mounted on the circuit board using a solder joint located between the circuit board and the semiconductor package; and
a protrusion fixed to an exposed surface of the lower portion of the encapsulant and located between the circuit board and the semiconductor package, wherein the protrusion extends beyond the lowest portion of a lead frame lead and contacting the circuit board to support the entire semiconductor package when it is mounted on the circuit board.

11. The device of claim 10, wherein there is a plurality of solder joints and the protrusion is positioned between the solder joints.

12. The device of claim 10, wherein there are at least three protrusions.

13. An electronic apparatus containing a semiconductor device, the device comprising:
a circuit board;
a semiconductor package containing a semiconductor chip encapsulated by an encapsulant, the package located on the circuit board;
a solder joint located between the circuit board and the semiconductor package; and
a protrusion located between the circuit board and the semiconductor package, the protrusion extending beyond the lowest portion of a lead frame lead and contacting the circuit board to support all of the semiconductor package when it is mounted on the circuit board.

14. The apparatus of claim 13, further comprising a plurality of solder joints and wherein the protrusion is positioned between the solder joints.

15. An electronic apparatus containing a semiconductor device, the device comprising:
a circuit board;
a semiconductor package containing a semiconductor chip encapsulated by an encapsulant, the package mounted on the circuit board using a solder joint located between the circuit board and the semiconductor package; and
a protrusion fixed to an exposed surface of the lower portion of the encapsulant and located between the circuit board and the semiconductor package, wherein the protrusion extends beyond the lowest portion of a lead frame lead and contacting the circuit board to supports the entire semiconductor package when it is mounted on the circuit board.

16. The apparatus of claim 15, further comprising is a plurality of solder joints and wherein the protrusion is positioned between the solder joints.

* * * * *